United States Patent
Jung

(10) Patent No.: US 10,177,901 B2
(45) Date of Patent: *Jan. 8, 2019

(54) SERIALIZER, AND SEMICONDUCTOR APPARATUS AND SYSTEM INCLUDING THE SAME

(71) Applicant: SK hynix Inc., Icheon-si, Gyeonggi-do (KR)

(72) Inventor: Hae Kang Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/960,290

(22) Filed: Apr. 23, 2018

(65) Prior Publication Data

US 2018/0241542 A1 Aug. 23, 2018

Related U.S. Application Data

(63) Continuation of application No. 15/279,617, filed on Sep. 29, 2016, now Pat. No. 9,979,535.

(30) Foreign Application Priority Data

May 3, 2016 (KR) .......................... 10-2016-0054661

(51) Int. Cl.
*H04L 7/00* (2006.01)
*H04L 7/033* (2006.01)
(Continued)

(52) U.S. Cl.
CPC .............. *H04L 7/033* (2013.01); *G11C 7/106* (2013.01); *H03M 9/00* (2013.01); *H04L 7/0016* (2013.01);
(Continued)

(58) Field of Classification Search
CPC ....... H04L 7/033; H04L 7/0016; H04L 25/00; H03M 9/00; G11C 7/106; G11C 7/1066; G11C 2207/107
See application file for complete search history.

(56) References Cited

U.S. PATENT DOCUMENTS 5,598,114 A 1/1997 Jamshidi
7,468,685 B1 12/2008 Macaluso
(Continued)

OTHER PUBLICATIONS

Jihwan Kim et al., ISSCC 2015 / Session 3 / Ultra-High-Speed Wireline Transceivers and Energy-Efficient Links / 3.5, "A 16-to-40Gb/s Quarter-Rate NRZ/PAM4 Dual-Mode Transmitter in 14nm CMOS," 2015 IEEE International Solid-State Circuits Conference, Feb. 23, 2015, 3 pages, Intel, Hillsboro, OR.

*Primary Examiner* — Syed Haider
(74) *Attorney, Agent, or Firm* — William Park & Associates Ltd.

(57) ABSTRACT

A serializer may be provided. The serializer may include a first data output circuit and a second data output circuit. The first data output circuit may provide first data to an output node in synchronization with a first phase clock and a second phase clock. The second data output circuit may provide second data to the output node in synchronization with the second phase clock and a third phase clock. The first data output circuit may perform a precharge operation or an emphasis operation for the second data output circuit, in synchronization with a third phase clock.

17 Claims, 5 Drawing Sheets

(51) Int. Cl.
*G11C 7/10* (2006.01)
*H03M 9/00* (2006.01)
*H04L 25/00* (2006.01)

(52) U.S. Cl.
CPC ............ *H04L 25/00* (2013.01); *G11C 7/1066* (2013.01); *G11C 2207/107* (2013.01)

(56) References Cited

U.S. PATENT DOCUMENTS

| | | | |
|---|---|---|---|
| 2002/0141280 A1* | 10/2002 | Hamamoto | G11C 7/1051 365/233.1 |
| 2003/0210603 A1 | 11/2003 | Ong | |
| 2005/0013178 A1* | 1/2005 | Suzuki | G11C 7/1051 365/194 |
| 2007/0024476 A1* | 2/2007 | Saeki | H03M 9/00 341/101 |
| 2007/0194956 A1* | 8/2007 | Jeon | H03M 9/00 341/100 |
| 2007/0242556 A1* | 10/2007 | Harada | G06F 1/04 365/210.13 |
| 2016/0043755 A1 | 2/2016 | Kim et al. | |

* cited by examiner

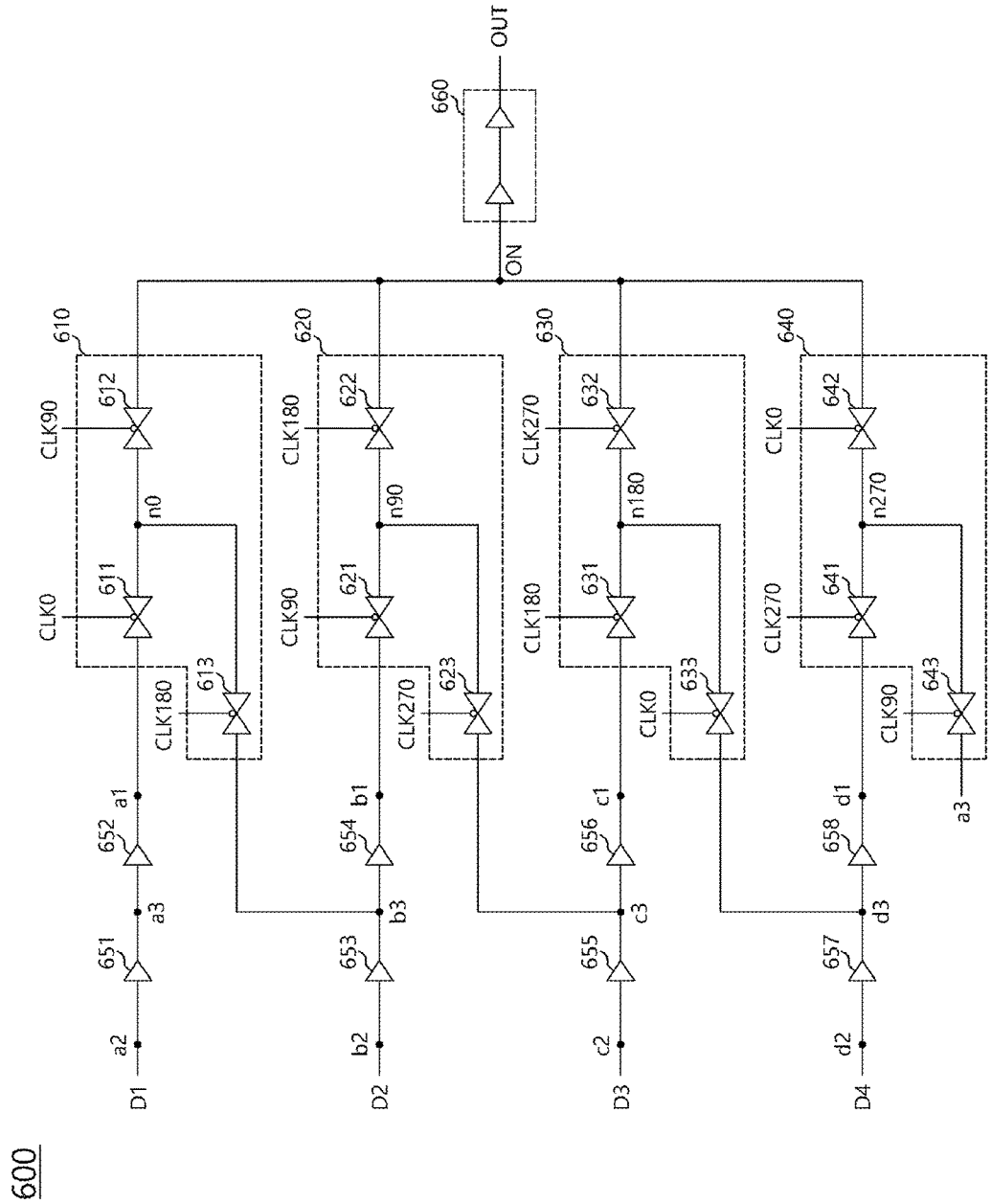

SERIALIZER, AND SEMICONDUCTOR APPARATUS AND SYSTEM INCLUDING THE SAME

CROSS-REFERENCES TO RELATED APPLICATION

The present application is a continuation application of U.S. Ser. No. 15/279,617 and claims priority under 35 U.S.C. § 119(a) to Korean application number 10-2016-0054661, filed on May 3, 2016, in the Korean Intellectual Property Office, which is incorporated herein by reference in its entirety.

BACKGROUND

1. Technical Field

Various embodiments may generally relate to a semiconductor technology, and, more particularly, to a serializer, and a semiconductor apparatus and a system including the same.

2. Related Art

Electronic apparatuses may include a large number of electronic components. Among the electronic apparatuses, a computer system may include many electronic components which are constructed by semiconductors. Semiconductor apparatuses which construct a computer system may transmit data in synchronization with a clock, and perform serial communication. In order to quickly process a large amount of data in the semiconductor apparatuses, each of the semiconductor apparatuses receives data inputted in series from another semiconductor apparatus, and converts the received data into a parallel type. Also, each of the semiconductor apparatuses may convert internal data of a parallel type into a serial type, and output the converted data to another semiconductor apparatus. That is to say, each of the semiconductor apparatuses may include a serializer which converts data of a parallel type into data of a serial type, to perform serial communication through a data bus.

A general serializer has a configuration to sequentially output a plurality of data in synchronization with the edge of a clock signal. Currently, when it comes to the development of computer systems and semiconductor apparatuses, their developments trend toward high speed operations and low power consumption. As the operating speed of a system is increased, the speed of a clock is gradually increased, and, as a system consumes less power, the amplitudes of the clock and data are decreased. Therefore, a serializer capable of precisely converting data in step with the recent technical trends is demanded in the art.

SUMMARY

In an embodiment, a system may be provided. In an embodiment, a transmitter circuit may be provided. In an embodiment, a semiconductor apparatus may be provided. In an embodiment, a serializer may be provided. The serializer may include a first data output circuit and a second data output circuit. The first data output circuit may provide first data to an output node in synchronization with a first phase clock and a second phase clock. The second data output circuit may provide second data to the output node in synchronization with the second phase clock and a third phase clock. The first data output circuit may perform a precharge operation or an emphasis operation for the second data output circuit, in synchronization with a third phase clock.

BRIEF DESCRIPTION OF THE DRAWINGS

FIG. 6 is a diagram illustrating a representation of an example of the configuration of a serializer in accordance with an embodiment.

DETAILED DESCRIPTION

Hereinafter, a serializer, and a semiconductor apparatus and a system including the same will be described below with reference to the accompanying drawings through various examples of embodiments.

Embodiments may provide a serializer having a structure in which data output circuits may operate complementarily to one another through precharge operations by adding minimum numbers of circuits and loads, and a semiconductor apparatus and a system including the same.

Figure 1:
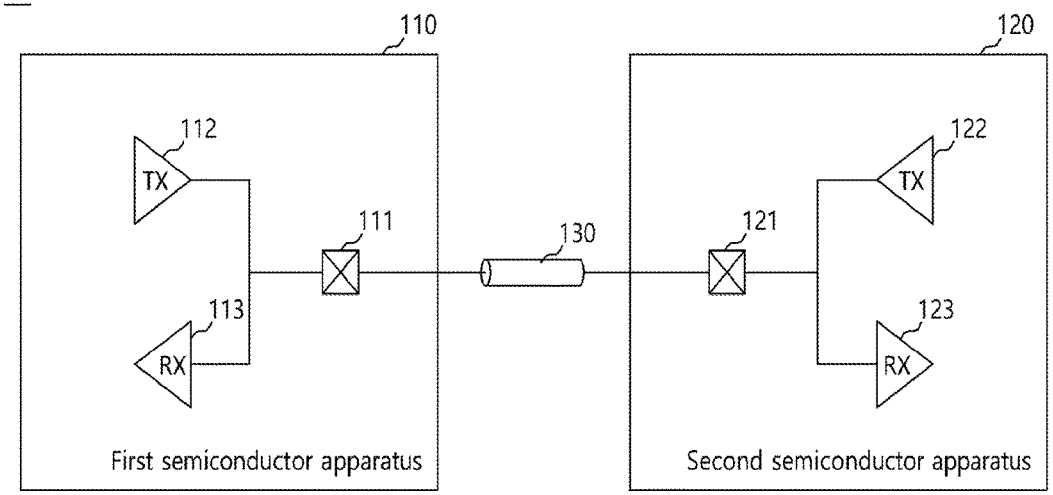
FIG. 1 is a diagram illustrating a representation of an example of the configuration of a system in accordance with an embodiment.

FIG. 1 is a diagram illustrating a representation of an example of the configuration of a system in accordance with an embodiment. Referring to FIG. 1, a system 1 in accordance with an embodiment may include a first semiconductor apparatus 110 and a second semiconductor apparatus 120. The first semiconductor apparatus 110 and the second semiconductor apparatus 120 may be electronic components which communicate with each other. In an embodiment, the first semiconductor apparatus 110 may be a master device, and the second semiconductor apparatus 120 may be a slave device which may operate by being controlled by the first semiconductor apparatus 110. For example, the first semiconductor apparatus 110 may be a host such as a processor, and the processor may include a central processing unit (CPU), a graphic processing unit (GPU), a multimedia processor (MMP) or a digital signal processor (DSP). Also, the first semiconductor apparatus 110 may be realized in the form of a system-on-chip (SOC) by combining processor chips having various functions, such as application processors. The second semiconductor apparatus 120 may be a memory, and the memory may include a volatile memory or a nonvolatile memory. The volatile memory may include an SRAM (static RAM), a DRAM (dynamic RAM) or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM) or an FRAM (ferroelectric RAM).

The first and second semiconductor apparatuses 110 and 120 may be coupled with each other through a signal transmission line 130. The first semiconductor apparatus 110 may include a pad 111, and the pad 111 may be coupled with the signal transmission line 130. The second semiconductor apparatus 120 may include a pad 121, and the pad 121 may be coupled with the signal transmission line 130. The signal transmission line 130 may be a channel, a link or a bus. The first semiconductor apparatus 110 may include a transmitter circuit (TX) 112 and a receiver circuit (RX) 113. The transmitter circuit 112 may generate an output signal according to an internal signal of the first semiconductor apparatus 110, and transmit the output signal to the second semiconductor apparatus 120 through the signal transmission line 130. The receiver circuit 113 may receive a signal transmitted from the second semiconductor apparatus 120 through the signal transmission line 130, and generate an internal signal. The second semiconductor apparatus 120 may include a transmitter circuit (TX) 122 and a receiver circuit (RX) 123. The transmitter circuit 122 may generate an output signal according to an internal signal of the second semiconductor apparatus 120, and transmit the output signal to the first semiconductor apparatus 110 through the signal transmission line 130. The receiver circuit 123 may receive a signal transmitted from the first semiconductor apparatus 110 through the signal transmission line 130, and generate an internal signal.

The signal transmission line 130 may be a data bus. The transmitter circuit 112 of the first semiconductor apparatus 110 may transmit the internal data of the first semiconductor apparatus 110 to the second semiconductor apparatus 120, and the receiver circuit 113 of the first semiconductor apparatus 110 may receive the data transmitted from the second semiconductor apparatus 120. The transmitter circuit 122 of the second semiconductor apparatus 120 may transmit the internal data of the second semiconductor apparatus 120 to the first semiconductor apparatus 110, and the receiver circuit 123 of the second semiconductor apparatus 120 may receive the data transmitted from the first semiconductor apparatus 110. The first and second semiconductor apparatuses 110 and 120 may perform serial communication, and the signal transmission line 130 may transmit data of a serial type. In order to quickly process a large amount data, the first and second semiconductor apparatuses 110 and 120 may use data of a serial type by converting it into data of a parallel type. Each of the receiver circuits 113 and 123 may include a parallelizer for converting data of a serial type into data of a parallel type. Each of the transmitter circuits 112 and 122 may include a serializer for converting data of a parallel type into data of a serial type.

Figure 2:
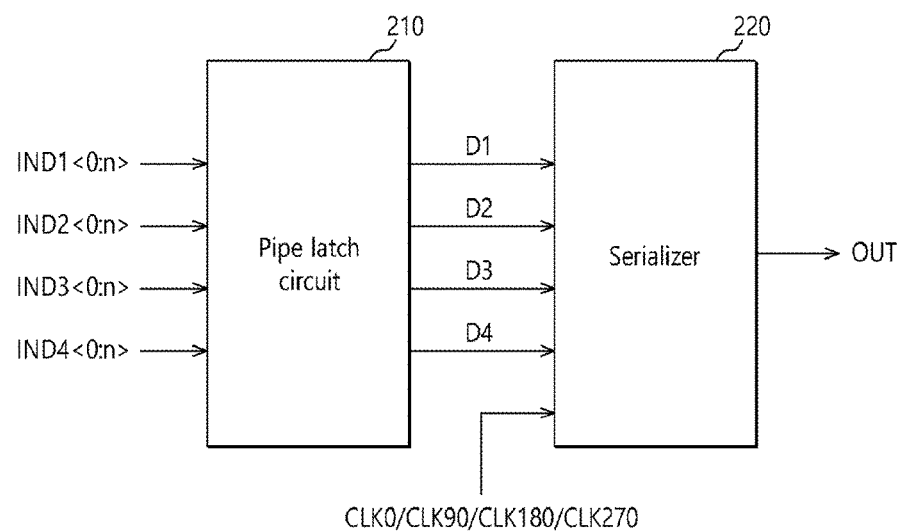
FIG. 2 is a diagram illustrating a representation of an example of the configuration of a transmitter circuit in accordance with an embodiment.

FIG. 2 is a diagram illustrating a representation of an example of the configuration of a transmitter circuit 200 in accordance with an embodiment. Referring to FIG. 2, the transmitter circuit 200 may be applied as the transmitter circuits 112 and 122 of the first and second semiconductor apparatuses 110 and 120 illustrated in FIG. 1. The transmitter circuit 200 may include a pipe latch circuit 210 and a serializer 220. The pipe latch circuit 210 may sequentially store a plurality of data of a parallel type by performing a pipelining operation. The pipe latch circuit 210 may receive a plurality of internal data groups IND1<0:n>, IND2<0:n>, IND3<0:n> and IND4<0:n>. The pipe latch circuit 210 may sequentially store the plurality of internal data groups IND1<0:n>, IND2<0:n>, IND3<0:n> and IND4<0:n>by using a pipe latch control signal. The plurality of internal data groups IND1<0:n>, IND2<0:n>, IND3<0:n> and IND4<0:n> may be data of a parallel type. The pipe latch circuit 210 may output stored data as first to fourth data D1, D2, D3 and D4.

The serializer 220 may receive the first to fourth data D1, D2, D3 and D4 and a plurality of clocks CLK0, CLK90, CLK180 and CLK270. The plurality of clocks CLK0, CLK90, CLK180 and CLK270 may have different phases. The serializer 220 may output the first to fourth data D1, D2, D3 and D4 as output data OUT in synchronization with the plurality of clocks CLK0, CLK90, CLK180 and CLK270. Referring to FIG. 2, for instance, the transmitter circuit 200 may perform the pipelining operation of aligning the plurality of internal data groups IND1<0:n>, IND2<0:n>, IND3<0:n> and IND4<0:n> and outputting sequentially four data, and output the four data sequentially as the output data OUT in synchronization with the four clocks CLK0, CLK90, CLK180 and CLK270. Accordingly, the output data OUT may be data of a serial type. The plurality of clocks may include a first phase clock CLK0, a second phase clock CLK90, a third phase clock CLK180 and a fourth phase clock CLK270. The first to fourth phase clocks CLK0, CLK90, CLK180 and CLK270 may have the phase difference of 90 degrees from one another. However, it is to be noted that the embodiments are not limited to such a case. The pipe latch circuit 210 may perform a pipelining operation of outputting sequentially eight internal data groups, and the serializer 220 may generate the output data OUT by using eight phase clocks which have, for example, the phase difference of 45 degrees from one another.

In a present embodiment, the respective first to fourth data D1, D2, D3 and D4 may have a window or duration corresponding to the cycle of the first to fourth phase clocks CLK0, CLK90, CLK180 and CLK270. In order for a double data rate operation, the first to fourth data D1, D2, D3 and D4 may have a phase difference corresponding to the ¼ cycle of the first to fourth phase clocks CLK0, CLK90, CLK180 and CLK270.

Figure 3:
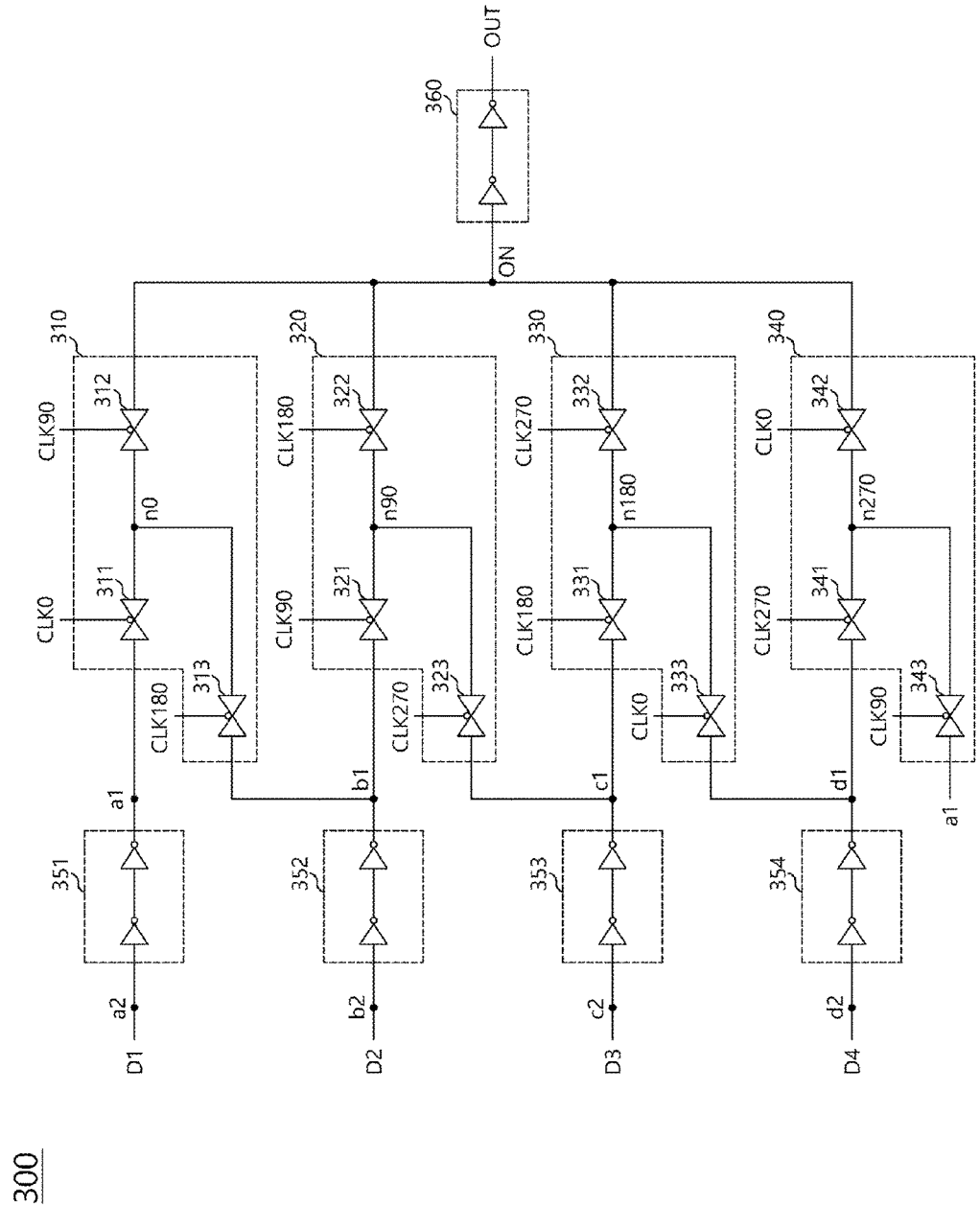
FIG. 3 is a diagram illustrating a representation of an example of the configuration of a serializer in accordance with an embodiment.

FIG. 3 is a diagram illustrating a representation of an example of the configuration of a serializer 300 in accordance with an embodiment. Referring to FIG. 3, the serializer 300 may be applied as the serializer 220 of FIG. 2. Referring to FIG. 3, the serializer 300 may include a first data output circuit 310 and a second data output circuit 320. The first data output circuit 310 may receive first data D1 through a first node a1. The first data output circuit 310 may receive a first phase clock CLK0, a second phase clock CLK90 and a third phase clock CLK180. The first data output circuit 310 may provide the first data D1 to an output node ON in synchronization with the first and second phase clocks CLK0 and CLK90. The second data output circuit 320 may receive second data D2 through a second node b1. The second data output circuit 320 may receive the second phase clock CLK90 and the third phase clock CLK180. The second data output circuit 320 may provide the second data D2 to the output node ON in synchronization with the second and third phase clocks CLK90 and CLK180. The first data output circuit 310 may perform a precharge operation or an emphasis operation for the second node b1. The first data output circuit 310 may precharge the second node b1 in synchronization with the third phase clock CLK180. The first data output circuit 310 provides additional charges to the second node b1 or additionally discharges the second node b1 in synchronization with the third phase clock CLK180.

The serializer 300 may further include a third data output circuit 330 and a fourth data output circuit 340. The third data output circuit 330 may receive third data D3 from a third node c1, and receive the third phase clock CLK180, a fourth phase clock CLK270 and the first phase clock CLK0. The third data output circuit 330 may provide the third data D3 to the output node ON in synchronization with the third and fourth phase clocks CLK180 and CLK270. The second data output circuit 320 may further receive the fourth phase clock CLK270. The second data output circuit 320 may perform a precharge operation or an emphasis operation for the third node c1. The second data output circuit 320 may precharge the third node c1 in synchronization with the fourth phase clock CLK270. The second data output circuit 320 provides additional charges to the third node c1 or additionally discharges the third node c1 in synchronization with the fourth phase clock CLK270.

The fourth data output circuit 340 may receive fourth data D4 from a fourth node d1, and receive the fourth phase clock CLK270, the first phase clock CLK0 and the second phase clock CLK90. The fourth data output circuit 340 may provide the fourth data D4 to the output node ON in synchronization with the fourth and first phase clocks CLK270 and CLK0. The third data output circuit 330 may perform a precharge operation or an emphasis operation for the fourth node d1. The third data output circuit 330 may precharge the fourth node d1 in synchronization with the first phase clock CLK0. The third data output circuit 330 provides additional charges to the fourth node d1 or additionally discharges the fourth node d1 in synchronization with the first phase clock CLK0, such that a precise signal may be outputted from the fourth data output circuit 340 to the output node ON. The fourth data output circuit 340 may perform a precharge operation or an emphasis operation for the first node a1. The fourth data output circuit 340 may precharge the first node a1 in synchronization with the second phase clock CLK90. The fourth data output circuit 340 provides additional charges to the first node a1 or additionally discharges the first node a1 in synchronization with the second phase clock CLK90.

The first data output circuit 310 may include a first pass gate 311, a second pass gate 312 and a first precharge circuit 313. The first pass gate 311 may be turned on during the high level period of the first phase clock CLK0. The first pass gate 311 may couple the first node a1 and a first intermediate node n0 and output the first data D1 to the first intermediate node n0, in response to the first phase clock CLK0. The second pass gate 312 may be turned on during the high level period of the second phase clock CLK90. The second pass gate 312 may couple the first intermediate node n0 and the output node ON and output the output of the first pass gate 311 to the output node ON, in synchronization with the second phase clock CLK90. The first precharge circuit 313 may be turned on during the high level period of the third phase clock CLK180. The first precharge circuit 313 may couple the first intermediate node n0 and the second node b1 in response to the third phase clock CLK180. The first precharge circuit 313 may provide the output of the first pass gate 311 to the second node b1 during the high level period of the third phase clock CLK180, thereby providing additional charges to the second node b1 or additionally discharging the second node b1. The first precharge circuit 313 may be constructed by a pass gate which couples the first intermediate node n0 and the second node b1 during the high level period of the third phase clock CLK180. The serializer 300 may further include a first input buffer 351. The first input buffer 351 may be coupled between a first input node a2 and the first node a1. The first input buffer 351 may receive and buffer the first data D1, and provide the first data D1 to the first node a1. Further, the levels of the signals may be different from or the opposite of those described. For example, a signal described as having a logic "high" level may alternatively have a logic "low" level, and a signal described as having a logic "low" level may alternatively have a logic "high" level.

The second data output circuit 320 may include a third pass gate 321, a fourth pass gate 322 and a second precharge circuit 323. The third pass gate 321 may be turned on during the high level period of the second phase clock CLK90. The third pass gate 321 may couple the second node b1 and a second intermediate node n90 and output the second data D2 to the second intermediate node n90, in response to the second phase clock CLK90. The fourth pass gate 322 may be turned on during the high level period of the third phase clock CLK180. The fourth pass gate 322 may couple the second intermediate node n90 and the output node ON and output the output of the third pass gate 321 to the output node ON, in synchronization with the third phase clock CLK180. The second precharge circuit 323 may be turned on during the high level period of the fourth phase clock CLK270. The second precharge circuit 323 may couple the second intermediate node n90 and the third node c1 in response to the fourth phase clock CLK270. The second precharge circuit 323 may provide the output of the third pass gate 321 to the third node c1 during the high level period of the fourth phase clock CLK270, thereby providing additional charges to the third node c1 or additionally discharging the third node c1. The second precharge circuit 323 may be constructed by a pass gate which couples the second intermediate node n90 and the third node c1 during the high level period of the fourth phase clock CLK270. The serializer 300 may further include a second input buffer 352. The second input buffer 352 may be coupled between a second input node b2 and the second node b1. The second input buffer 352 may receive and buffer the second data D2, and provide the second data D2 to the second node b1. Further, the levels of the signals may be different from or the opposite of those described. For example, a signal described as having a logic "high" level may alternatively have a logic "low" level, and a signal described as having a logic "low" level may alternatively have a logic "high" level.

The third data output circuit 330 may include a fifth pass gate 331, a sixth pass gate 332 and a third precharge circuit 333. The fifth pass gate 331 may be turned on during the high level period of the third phase clock CLK180. The fifth pass gate 331 may couple the third node c1 and a third intermediate node n180 and output the third data D3 to the third intermediate node n180, in response to the third phase clock CLK180. The sixth pass gate 332 may be turned on during the high level period of the fourth phase clock CLK270. The sixth pass gate 332 may couple the third intermediate node n180 and the output node ON and output the output of the fifth pass gate 331 to the output node ON, in synchronization with the fourth phase clock CLK270. The third precharge circuit 333 may be turned on during the high level period of the first phase clock CLK0. The third precharge circuit 333 may couple the third intermediate node n180 and the fourth node d1 in response to the first phase clock CLK0. The third precharge circuit 333 may provide the output of the fifth pass gate 331 to the fourth node d1 during the high level period of the first phase clock CLK0, thereby providing additional charges to the fourth node d1 or additionally discharging the fourth node d1. The third precharge circuit 333 may be constructed by a pass gate which couples the third intermediate node n180 and the fourth node d1 during the high level period of the first phase clock CLK0. The serializer 300 may further include a third input buffer 353. The third input buffer 353 may be coupled between a third input node c2 and the third node c1. The third input buffer 353 may receive and buffer the third data D3, and provide the third data D3 to the third node c1. Further, the levels of the signals may be different from or the opposite of those described. For example, a signal described as having a logic "high" level may alternatively have a logic "low" level, and a signal described as having a logic "low" level may alternatively have a logic "high" level.

The fourth data output circuit 340 may include a seventh pass gate 341, an eighth pass gate 342 and a fourth precharge circuit 343. The seventh pass gate 341 may be turned on during the high level period of the fourth phase clock CLK270. The seventh pass gate 341 may couple the fourth node d1 and a fourth intermediate node n270 and output the fourth data D4 to the fourth intermediate node n270, in response to the fourth phase clock CLK270. The eighth pass gate 342 may be turned on during the high level period of the first phase clock CLK0. The eighth pass gate 342 may couple the fourth intermediate node n270 and the output node ON and output the output of the seventh pass gate 341 to the output node ON, in synchronization with the first phase clock CLK0. The fourth precharge circuit 343 may be turned on during the high level period of the second phase clock CLK90. The fourth precharge circuit 343 may couple the fourth intermediate node n270 and the first node a1 in response to the second phase clock CLK90. The fourth precharge circuit 343 may provide the output of the seventh pass gate 341 to the first node a1 during the high level period of the second phase clock CLK90, thereby providing additional charges to the first node a1 or additionally discharging the first node a1. The fourth precharge circuit 343 may be constructed by a pass gate which couples the fourth intermediate node n270 and the first node a1 during the high level period of the second phase clock CLK90. The serializer 300 may further include a fourth input buffer 354. The fourth input buffer 354 may be coupled between a fourth input node d2 and the fourth node d1. The fourth input buffer 354 may receive and buffer the fourth data D4, and provide the fourth data D4 to the fourth node d1. Further, the levels of the signals may be different from or the opposite of those described. For example, a signal described as having a logic "high" level may alternatively have a logic "low" level, and a signal described as having a logic "low" level may alternatively have a logic "high" level.

The serializer 300 may further include an output buffer 360. The output buffer 360 may be coupled with the output node ON, buffer the voltage level of the output node ON, and generate output data OUT.

Figure 4:
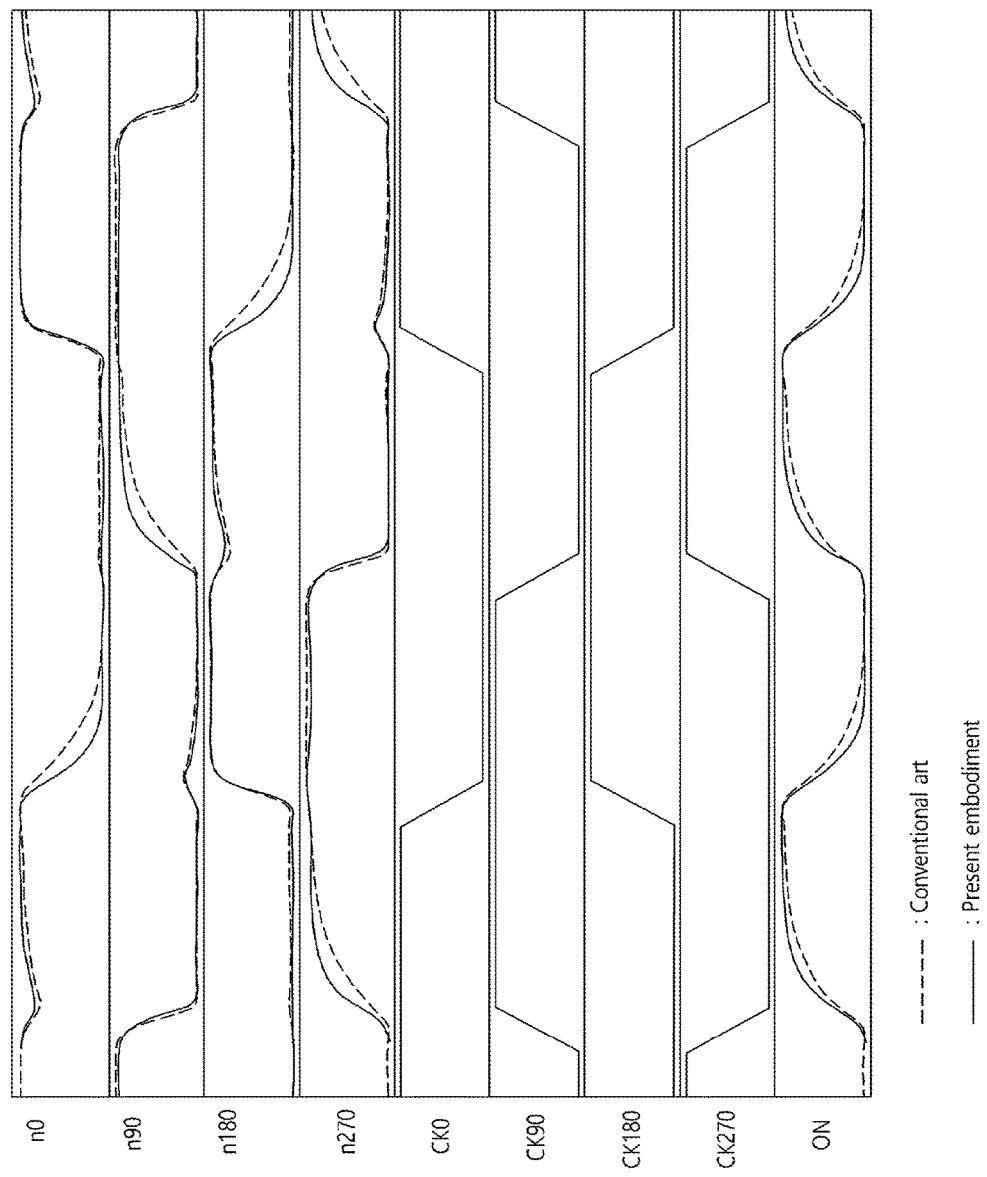
FIG. 4 is a representation of an example of a waveform diagram to assist in the explanation of the operation of the serializer in accordance with an embodiment.

FIG. 4 is a representation of an example of a waveform diagram to assist in the explanation of the operation of the serializer 300 illustrated in FIG. 3. The operation of the serializer 300 in accordance with an embodiment will be described below with reference to FIGS. 3 and 4. It is exemplified that the first to fourth data D1, D2, D3 and D4 alternately have a high level and a low level. The first to fourth data D1, D2, D3 and D4 may have a window or duration corresponding to one cycle of the first to fourth phase clocks CLK0, CLK90, CLK180 and CLK270. When the first and second phase clocks CLK0 and CLK90 are a high level, the first data D1 having the high level may be provided to the output node ON through the first and second pass gates 311 and 312. At this time, the fourth precharge circuit 343 may provide the fourth data D4 having the high level to the first node a1 in synchronization with the second phase clock CLK90. According to this fact, more charges may be introduced into the first node a1, and the voltage levels of the first intermediate node n0 and the output node ON may be quickly raised when compared to the conventional art.

When the second and third phase clocks CLK90 and CLK180 are at the high level, the second data D2 having the low level may be provided to the output node ON through the third and fourth pass gates 321 and 322. At this time, the first precharge circuit 313 may provide the first data D1 having the low level to the second node b1 in synchronization with the third phase clock CLK180. According to this fact, the second node b1 may be quickly discharged, and the voltage levels of the second intermediate node n90 and the output node ON may be quickly lowered when compared to the conventional art.

When the third and fourth phase clocks CLK180 and CLK270 are the high level, the third data D3 having the high level may be provided to the output node ON through the fifth and sixth pass gates 331 and 332. At this time, the second precharge circuit 323 may provide the second data D2 having the high level to the third node c1 in synchronization with the fourth phase clock CLK270. According to this fact, more charges may be introduced into the third node c1, and the voltage levels of the third intermediate node n180 and the output node ON may be quickly raised when compared to the conventional art.

When the fourth and first phase clocks CLK270 and CLK0 are the high level, the fourth data D4 having the low level may be provided to the output node ON through the seventh and eighth pass gates 341 and 342. At this time, the third precharge circuit 333 may provide the third data D3 having the low level to the fourth node d1 in synchronization with the first phase clock CLK0. According to this fact, the voltage levels of the fourth intermediate node n270 and the output node ON may be quickly lowered. As described above, the first to fourth precharge circuits 313, 323, 333 and 343 may provide additional charges to the first to fourth nodes a1, b1, c1 and d1 or additionally discharge the first to fourth nodes a1, b1, c1 and d1, thereby increasing the slope of the voltage level change or slew rate of the output node ON. As a consequence, the output data OUT outputted from the serializer 300 may have a wider valid window or duration, and a precise output signal may be generated even though the cycle of a clock is shortened for a high speed.

Figure 5:
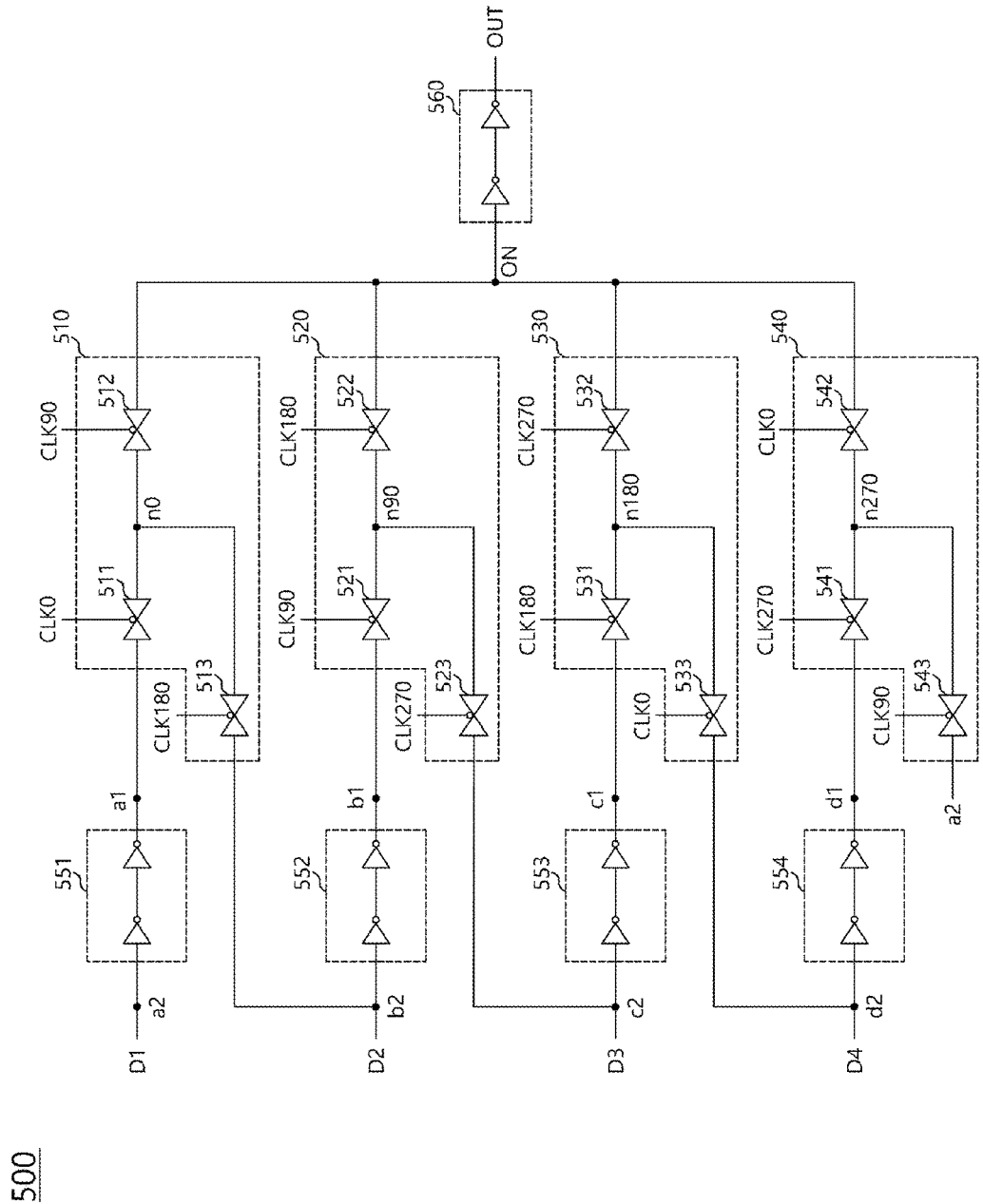
FIG. 5 is a diagram illustrating a representation of an example of the configuration of a serializer in accordance with an embodiment.

FIG. 5 is a diagram illustrating a representation of an example of the configuration of a serializer 500 in accordance with an embodiment. The serializer 500 may be applied as the serializer 220 illustrated in FIG. 2. Referring to FIG. 5, the serializer 500 may include a first input buffer 551, a first data output circuit 510, a second input buffer 552 and a second data output circuit 520. The first input buffer 551 may receive first data D1 through a first input node a2, and output a buffered signal to a first node a1. The first data output circuit 510 may receive the output of the first input buffer 551 through the first node a1. The first data output circuit 510 may receive a first phase clock CLK0, a second phase clock CLK90 and a third phase clock CLK180. The first data output circuit 510 may provide the output of the first input buffer 551 to an output node ON in synchronization with the first and second phase clocks CLK0 and CLK90. The first data output circuit 510 may perform a precharge operation or an emphasis operation for the second data output circuit 520, in synchronization with the third phase clock CLK180.

The second input buffer 552 may receive second data D2 through a second input node b2, and output a buffered signal to a second node b1. The second data output circuit 520 may receive the output of the second input buffer 552 through the second node b1. The second data output circuit 520 may receive the second phase clock CLK90 and the third phase clock CLK180. The second data output circuit 520 may provide the output of the second input buffer 552 to the output node ON in synchronization with the second and third phase clocks CLK90 and CLK180. The first data output circuit 510 may provide additional charges to the second input node b2 or additionally discharge the second input node b2 in synchronization with the third phase clock CLK180, thereby precharging the second input node b2.

The serializer 500 may further include a third input buffer 553, a third data output circuit 530, a fourth input buffer 554 and a fourth data output circuit 540. The third input buffer 553 may receive third data D3 through a third input node c2, and output a buffered signal to a third node c1. The third data output circuit 530 may receive the output of the third input buffer 553 through the third node c1. The third data output circuit 530 may receive the third phase clock CLK180 and a fourth phase clock CLK270. The third data output circuit 530 may provide the output of the third input buffer 553 to the output node ON in synchronization with the third and fourth phase clocks CLK180 and CLK270. The second data output circuit 520 may perform a precharge operation or an emphasis operation for the third data output circuit 530. The second data output circuit 520 may further receive the fourth phase clock CLK270, and provide additional charges to the third input node c2 or additionally discharge the third input node c2 in synchronization with the fourth phase clock CLK270, thereby precharging the third input node c2.

The fourth input buffer 554 may receive fourth data D4 through a fourth input node d2, and output a buffered signal to a fourth node d1. The fourth data output circuit 540 may receive the output of the fourth input buffer 554 through the fourth node d1. The fourth data output circuit 540 may receive the fourth phase clock CLK270, the first phase clock CLK0 and the second phase clock CLK90. The fourth data output circuit 540 may provide the output of the fourth input buffer 554 to the output node ON in synchronization with the fourth and first phase clocks CLK270 and CLK0. The third data output circuit 530 may perform a precharge operation or an emphasis operation for the fourth data output circuit 540. The third data output circuit 530 may further receive the first phase clock CLK0, and provide additional charges to the fourth input node d2 or additionally discharge the fourth input node d2 in synchronization with the first phase clock CLK0, thereby precharging the fourth input node d2. The fourth data output circuit 540 may perform a precharge operation or an emphasis operation for the first data output circuit 510. The fourth data output circuit 540 may provide additional charges to the first input node a2 or additionally discharge the first input node a2 in synchronization with the second phase clock CLK90, thereby precharging the first input node a2.

The first data output circuit 510 may include a first pass gate 511, a second pass gate 512 and a first precharge circuit 513. The first pass gate 511 may output the output of the first input buffer 551 to a first intermediate node n0 in response to the first phase clock CLK0. The second pass gate 512 may output the output of the first pass gate 511 to the output node ON in response to the second phase clock CLK90. The first precharge circuit 513 may couple the first intermediate node n0 and the second input node b2 in response to the third phase clock CLK180. The first precharge circuit 513 may additionally change the voltage level of the second input node b2 according to the voltage level of the first intermediate node n0 during the high level period of the third phase clock CLK180. The first precharge circuit 513 may provide additional charges to the second input node b2 or additionally discharge the second input node b2 according to the voltage level of the first intermediate node n0. Further, the levels of the signals may be different from or the opposite of those described. For example, a signal described as having a logic "high" level may alternatively have a logic "low" level, and a signal described as having a logic "low" level may alternatively have a logic "high" level.

The second data output circuit 520 may include a third pass gate 521, a fourth pass gate 522 and a second precharge circuit 523. The third pass gate 521 may output the output of the second input buffer 552 to a second intermediate node n90 in response to the second phase clock CLK90. The fourth pass gate 522 may output the output of the third pass gate 521 to the output node ON in response to the third phase clock CLK180. The second precharge circuit 523 may couple the second intermediate node n90 and the third input node c2 in response to the fourth phase clock CLK270. The second precharge circuit 523 may additionally change the voltage level of the third input node c2 according to the voltage level of the second intermediate node n90 during the high level period of the fourth phase clock CLK270. The second precharge circuit 523 may provide additional charges to the third input node c2 or additionally discharge the third input node c2 according to the voltage level of the second intermediate node n90. Further, the levels of the signals may be different from or the opposite of those described. For example, a signal described as having a logic "high" level may alternatively have a logic "low" level, and a signal described as having a logic "low" level may alternatively have a logic "high" level.

The third data output circuit 530 may include a fifth pass gate 531, a sixth pass gate 532 and a third precharge circuit 533. The fifth pass gate 531 may output the output of the third input buffer 553 to a third intermediate node n180 in response to the third phase clock CLK180. The sixth pass gate 532 may output the output of the fifth pass gate 531 to the output node ON in response to the fourth phase clock CLK270. The third precharge circuit 533 may couple the third intermediate node n180 and the fourth input node d2 in response to the first phase clock CLK0. The third precharge circuit 533 may additionally change the voltage level of the fourth input node d2 according to the voltage level of the third intermediate node n180 during the high level period of the first phase clock CLK0. The third precharge circuit 533 may provide additional charges to the fourth input node d2 or additionally discharge the fourth input node d2 according to the voltage level of the third intermediate node n180. Further, the levels of the signals may be different from or the opposite of those described. For example, a signal described as having a logic "high" level may alternatively have a logic "low" level, and a signal described as having a logic "low" level may alternatively have a logic "high" level.

The fourth data output circuit 540 may include a seventh pass gate 541, an eighth pass gate 542 and a fourth precharge circuit 543. The seventh pass gate 541 may output the output of the fourth input buffer 554 to a fourth intermediate node n270 in response to the fourth phase clock CLK270. The eighth pass gate 542 may output the output of the seventh pass gate 541 to the output node ON in response to the first phase clock CLK0. The fourth precharge circuit 543 may couple the fourth intermediate node n270 and the first input node a2 in response to the second phase clock CLK90. The fourth precharge circuit 543 may additionally change the voltage level of the first input node a2 according to the voltage level of the fourth intermediate node n270 during the high level period of the second phase clock CLK90. The fourth precharge circuit 543 may provide additional charges to the first input node a2 or additionally discharge the first input node a2 according to the voltage level of the fourth intermediate node n270. Further, the levels of the signals may be different from or the opposite of those described. For example, a signal described as having a logic "high" level may alternatively have a logic "low" level, and a signal described as having a logic "low" level may alternatively have a logic "high" level.

The serializer 500 may further include an output buffer 560. The output buffer 560 may buffer the voltage level of the output node ON, and output output data OUT.

The first to fourth precharge circuits 513, 523, 533 and 543 illustrated in FIG. 5 may be coupled to the first to fourth input nodes a2, b2, c2 and d2, respectively, unlike that the first to fourth precharge circuits 313, 323, 333 and 343 illustrated in FIG. 3 are coupled to the first to fourth nodes a1, b1, c1 and d1, respectively. Referring to FIG. 3, the first pass gate 311 has a load corresponding to three pass gates, that is, the second pass gate 312, the first precharge circuit 313 and the fourth precharge circuit 343. Similarly, each of the third, fifth and seventh pass gates 321, 331 and 341 has a load corresponding to three pass gates. Conversely, each of the second, fourth, sixth and eighth pass gates 312, 322, 332 and 342 has a load corresponding to two pass gates. Referring to FIG. 5, in the case where the first to fourth precharge circuits 513, 523, 533 and 543 are coupled to the first to fourth input nodes a2, b2, c2 and d2, each of the first to eighth pass gates 511, 512, 521, 522, 531, 532, 541 and 542 may have a load corresponding to two pass gates. Accordingly, the serializer 500 may stably generate an output signal at a high speed operation.

FIG. 6 is a diagram illustrating a representation of an example of the configuration of a serializer 600 in accordance with an embodiment. The serializer 600 may be applied as the serializer 220 illustrated in FIG. 2. Referring to FIG. 6, the serializer 600 may include a first data output circuit 610, a second data output circuit 620, a third data output circuit 630, a fourth data output circuit 640 and an output buffer 660, similarly to the serializer 500 illustrated in FIG. 5. The first data output circuit 610 may include a first pass gate 611, a second pass gate 612 and a first precharge circuit 613 which operate in response to first to third phase clocks CLK0, CLK90 and CLK180, respectively. The second data output circuit 620 may include a third pass gate 621, a fourth pass gate 622 and a second precharge circuit 623 which operate in response to second to fourth phase clocks CLK90, CLK180 and CLK270, respectively. The third data output circuit 630 may include a fifth pass gate 631, a sixth pass gate 632 and a third precharge circuit 633 which operate in response to the third, fourth and first phase clocks CLK180, CLK270 and CLK0, respectively. The fourth data output circuit 640 may include a seventh pass gate 641, an eighth pass gate 642 and a fourth precharge circuit 643 which operate in response to the fourth, first and second phase clocks CLK270, CLK0 and CLK90, respectively.

Referring to FIG. 6, the serializer 600 may include first to eighth input buffers 651, 652, 653, 654, 655, 656, 657 and 658. The first input buffer 651 may receive first data D1 through a first input node a2, and output a buffered signal to a first buffering node a3. The second input buffer 652 may receive the output of the first input buffer 651 through the first buffering node a3, and output a buffered signal to a first node a1. The first data D1 may be provided to the first node a1 by being sequentially buffered through the first and second input buffers 651 and 652. The third input buffer 653 may receive second data D2 through a second input node b2, and output a buffered signal to a second buffering node b3. The fourth input buffer 654 may receive the output of the third input buffer 653 through the second buffering node b3, and output a buffered signal to a second node b1. The second data D2 may be provided to the second node b1 by being sequentially buffered through the third and fourth input buffers 653 and 654. The fifth input buffer 655 may receive third data D3 through a third input node c2, and output a buffered signal to a third buffering node c3. The sixth input buffer 656 may receive the output of the fifth input buffer 655 through the third buffering node c3, and output a buffered signal to a third node c1. The third data D3 may be provided to the third node c1 by being sequentially buffered through the fifth and sixth input buffers 655 and 656. The seventh input buffer 657 may receive fourth data D4 through a fourth input node d2, and output a buffered signal to a fourth buffering node d3. The eighth input buffer 658 may receive the output of the seventh input buffer 657 through the fourth buffering node d3, and output a buffered signal to a fourth node d1. The fourth data D4 may be provided to the fourth node d1 by being sequentially buffered through the seventh and eighth input buffers 657 and 658.

Referring to FIG. 6, the first precharge circuit 613 may be coupled between a first intermediate node n0 and the second buffering node b3, and precharge the second buffering node b3. The second precharge circuit 623 may be coupled between a second intermediate node n90 and the third buffering node c3, and precharge the third buffering node c3. The third precharge circuit 633 may be coupled between a third intermediate node n180 and the fourth buffering node d3, and precharge the fourth buffering node d3. The fourth precharge circuit 643 may be coupled between a fourth intermediate node n270 and the first buffering node a3, and precharge the first buffering node a3. By the above-described coupling relationships, the first to fourth precharge circuits 613, 623, 633 and 643 may anticipate stable loads, and the serializer 600 may generate precise output data OUT through the output node ON and the output buffer 660.

While various embodiments have been described above, it will be understood to those skilled in the art that the embodiments described are examples only. Accordingly, the serializer, and the semiconductor apparatus and the system including the same described herein should not be limited based on the described embodiments.

What is claimed is:

1. A serializer comprising:
    a first data output circuit configured to receive first data through a first node, provide the first data to a first intermediate node in synchronization with a first phase clock, couple the first intermediate node to an output node in synchronization with a second phase clock, and precharge a second node based on a voltage level of the first intermediate node in synchronization with a third phase clock; and
    a second data output circuit configured to receive second data through the second node, provide the second data to a second intermediate node in synchronization with the second phase clock, and couple the second intermediate node to the output node in synchronization with the third phase clock.

2. The serializer according to claim 1, further comprising:
    a third data output circuit configured to receive third data through a third node, provide the third data to a third intermediate node in synchronization with the third phase clock, and couple the third intermediate node to the output node in synchronization with a fourth phase clock,
    wherein the second data output circuit precharges the third node based on a voltage level of the second intermediate node in synchronization with the fourth phase clock.

3. The serializer according to claim 2, further comprising:
a fourth data output circuit configured to receive fourth data through a fourth node, provide the fourth data to a fourth intermediate node in synchronization with the fourth phase clock, couple the fourth intermediate node to the output node in synchronization with the first phase clock, and precharge the first node based on a voltage level of the fourth intermediate node in synchronization with the second phase clock,
wherein the third data output circuit precharges the fourth node based on a voltage level of the third intermediate node in synchronization with the first phase clock.

4. The serializer according to claim 3, wherein the first data output circuit comprises:
a first pass gate configured to output the first data based on the first phase clock;
a second pass gate configured to output an output of the first pass gate to the output node based on the second phase clock; and
a first precharge circuit configured to provide the output of the first pass gate to the second node based on the third phase clock.

5. The serializer according to claim 4, wherein the second data output circuit comprises:
a third pass gate configured to output the second data based on the second phase clock;
a fourth pass gate configured to output an output of the third pass gate to the output node based on the third phase clock; and
a second precharge circuit configured to provide the output of the third pass gate to the third node based on the fourth phase clock.

6. The serializer according to claim 5, wherein the third data output circuit comprises:
a fifth pass gate configured to output the third data based on the third phase clock;
a sixth pass gate configured to output an output of the fifth pass gate to the output node based on the fourth phase clock; and
a third precharge circuit configured to provide the output of the fifth pass gate to the fourth node based on the first phase clock.

7. The serializer according to claim 6, wherein the fourth data output circuit comprises:
a seventh pass gate configured to output the fourth data based on the fourth phase clock;
an eighth pass gate configured to output an output of the seventh pass gate to the output node based on the first phase clock; and
a fourth precharge circuit configured to provide the output of the seventh pass gate to the first node based on the second phase clock.

8. A serializer comprising:
a first data output circuit configured to receive first data through a first node, provide the first data to a first intermediate node in synchronization with a first phase clock, couple the first intermediate node to an output node in synchronization with a second phase clock, and perform an emphasis operation for a second node, based on a voltage level of the first intermediate node in synchronization with the third phase clock; and
a second data output circuit configured to receive second data through the second node, provide the second data to a second intermediate node in synchronization with the second phase clock, and couple the second intermediate node to the output node in synchronization with the third phase clock.

9. The serializer according to claim 8, further comprising:
a third data output circuit configured to receive third data through a third node, provide the third data to a third intermediate node in synchronization with the third phase clock, and couple the third intermediate node to the output node in synchronization with a fourth phase clock,
wherein the second data output circuit performs an emphasis operation for the third node, based on a voltage level of the second intermediate node in synchronization with the fourth phase clock.

10. The serializer according to claim 9, further comprising:
a fourth data output circuit configured to receive fourth data through a fourth node, provide the fourth data to a fourth intermediate node in synchronization with the fourth phase clock, couple the fourth intermediate node to the output node in synchronization with the first phase clock, and perform an emphasis operation for the first node, based on a voltage level of the fourth intermediate node in synchronization with the second phase clock,
wherein the third data output circuit performs an emphasis operation for the fourth node, based on a voltage level of the third intermediate node in synchronization with the first phase clock.

11. The serializer according to claim 10, wherein the first data output circuit comprises:
a first pass gate configured to output the first data to the first intermediate node in synchronization with the first phase clock;
a second pass gate configured to output an output of the first pass gate to the output node in synchronization with the second phase clock; and
a first precharge circuit configured to change a voltage level of the second node according to a voltage level of the first intermediate node in synchronization with the third phase clock.

12. The serializer according to claim 11, wherein the second data output circuit comprises:
a third pass gate configured to output the second data to the second intermediate node in synchronization with the second phase clock;
a fourth pass gate configured to output an output of the third pass gate to the output node in synchronization with the third phase clock; and
a second precharge circuit configured to change a voltage level of the third node according to a voltage level of the second intermediate node in synchronization with the fourth phase clock.

13. The serializer according to claim 12, wherein the third data output circuit comprises:
a fifth pass gate configured to output the third data to the third intermediate node in synchronization with the third phase clock;
a sixth pass gate configured to output an output of the fifth pass gate to the output node in synchronization with the fourth phase clock; and
a third precharge circuit configured to change a voltage level of the fourth node according to a voltage level of the third intermediate node in synchronization with the first phase clock.

14. The serializer according to claim 13, wherein the fourth data output circuit comprises:
a seventh pass gate configured to output the fourth data to the fourth intermediate node in synchronization with the fourth phase clock;

an eighth pass gate configured to output an output of the seventh pass gate to the output node in synchronization with the first phase clock; and a fourth precharge circuit configured to change a voltage level of the first node according to a voltage level of the fourth intermediate node in synchronization with the second phase clock.

15. A serializer comprising:

a first data output circuit configured to receive first data through a first node in synchronization with a first phase clock, couple a first intermediate node to an output node in synchronization with a second phase clock, and couple a second node to the first intermediate node in synchronization with a third phase clock; and a second data output circuit configured to receive second data through a second node, couple a second intermediate node to the second node in synchronization with the second phase clock, and couple the second intermediate node to the output node in synchronization with the third phase clock.

16. The serializer according to claim 15, further comprising:

a third data output circuit configured to receive third data through a third node, couple a third intermediate node to the third node in synchronization with the third phase clock, and couple the third intermediate node to the output node in synchronization with a fourth phase clock, wherein the second data output circuit is configured to couple the second intermediate node to the third node in synchronization with the fourth phase clock.

17. The serializer according to claim 16, further comprising:

a fourth data output circuit configured to receive fourth data through a fourth node, couple a fourth intermediate node to the fourth node in synchronization with the fourth phase clock, couple the fourth intermediate node to the output node in synchronization with the first phase clock, and couple the fourth intermediate node to the first node in synchronization with the second phase clock, wherein the third data output circuit is configured to couple the third intermediate node to the fourth node in synchronization with the first phase clock.

* * * * *